United States Patent
Uta et al.

(10) Patent No.: US 10,590,322 B2
(45) Date of Patent: Mar. 17, 2020

(54) HEAT DISSIPATION MATERIAL

(71) Applicant: SHIN-ETSU CHEMICAL CO., LTD., Tokyo (JP)

(72) Inventors: Akira Uta, Annaka (JP); Masayuki Ikeno, Annaka (JP); Nobuaki Matsumoto, Annaka (JP); Kohei Masuda, Annaka (JP); Takafumi Sakamoto, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 98 days.

(21) Appl. No.: 15/579,509

(22) PCT Filed: May 25, 2016

(86) PCT No.: PCT/JP2016/065414
§ 371 (c)(1),
(2) Date: Dec. 4, 2017

(87) PCT Pub. No.: WO2017/002489
PCT Pub. Date: Jan. 5, 2017

(65) Prior Publication Data
US 2018/0163113 A1 Jun. 14, 2018

(30) Foreign Application Priority Data
Jun. 30, 2015 (JP) .................. 2015-130903

(51) Int. Cl.
| C09K 5/14 | (2006.01) |
| C08G 77/52 | (2006.01) |
| C08K 3/00 | (2018.01) |
| C08L 83/14 | (2006.01) |
| H01L 23/36 | (2006.01) |
| H01L 23/373 | (2006.01) |
| C08K 3/22 | (2006.01) |
| C08K 7/18 | (2006.01) |

(52) U.S. Cl.
CPC ............ *C09K 5/14* (2013.01); *C08G 77/52* (2013.01); *C08K 3/00* (2013.01); *C08K 3/22* (2013.01); *C08K 7/18* (2013.01); *C08L 83/14* (2013.01); *H01L 23/36* (2013.01); *H01L 23/373* (2013.01); *H01L 23/3733* (2013.01); *H01L 23/3737* (2013.01); *C08K 2003/2227* (2013.01); *C08K 2201/001* (2013.01)

(58) Field of Classification Search
CPC ........... C08G 77/52; C08K 3/22; H01L 23/36; H01L 23/3737; H01L 23/3738
See application file for complete search history.

(56) References Cited

U.S. PATENT DOCUMENTS

| 3,959,403 A | * | 5/1976 | LaRochelle | ............ C08G 77/44 528/12 |
| 5,035,927 A | | 7/1991 | Chen et al. | |
| 2012/0153342 A1 | | 6/2012 | Nishimura et al. | |
| 2017/0115075 A1 | | 4/2017 | Hirata et al. | |

FOREIGN PATENT DOCUMENTS

| JP | 63-230768 A | 9/1988 |
| JP | 2010-253774 A | 11/2010 |
| JP | 2012-49567 A | 3/2012 |
| JP | 2014-80522 A | 5/2014 |
| JP | 2015-71662 A | 4/2015 |
| JP | 2015-78296 A | 4/2015 |
| JP | 2015-160862 A | 9/2015 |
| WO | WO 2016/024516 A1 | 2/2016 |

OTHER PUBLICATIONS

Williams (Macromolecules, 24(7) (1991) 1445-1448).*
(Continued)

*Primary Examiner* — Kuo Liang Peng
(74) *Attorney, Agent, or Firm* — Birch, Stewart, Kolasch & Birch, LLP

(57) ABSTRACT

Provided is a heat dissipation material comprising a mesogen/silicon compound (co)polymer having a number average molecular weight of 1,000-500,000, represented by general formula (1).

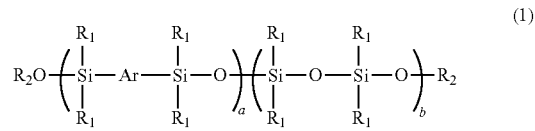

(1)

(Ar is a mesogen group selected from the structure represented by the following formulas.

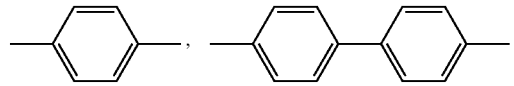

a represents a positive number from 0.5 to 1, b represents a number from 0 to 0.5 (with the caveat that a and b each represent the ratio of each number of repeating units in molecules, and a+b=1). $R_1$ is independently a monovalent hydrocarbon group which does not independently include a $C_{1-8}$ aliphatic unsaturated bond. $R_2$ is independently a hydrogen atom, $-Si(CH_3)_3$, $-Si(CH_3)_2(OH)$, $-Si(CH_3)_2(CH=CH)$ or $-Si(CH_3)_2(CH_2-CH=CH_2)$).

This heat dissipation material has excellent thermal conductivity, and further shows good thermoplastic properties and has excellent moldability, and hence can be suitably used as a resin material for heat dissipation materials and semiconductor devices and electronic parts in particular.

4 Claims, No Drawings

(56) References Cited

OTHER PUBLICATIONS

Brinker (Journal of Non-Crystalline Solids, 100 (1988) 31-50).*
International Search Report for PCT/JP2016/065414 dated Aug. 30, 2016.
Written Opinion of the International Searching Authority for PCT/JP2016/065414 (PCT/ISA/237) dated Aug. 30, 2016.
Office Action dated Jan. 29, 2019, in Japanese Patent Application No. 2017-526220.

* cited by examiner

HEAT DISSIPATION MATERIAL

TECHNICAL FIELD

The present invention relates to a heat dissipation material comprising a mesogen/silicon compound (co)polymer having high thermal conductivity, and a heat dissipation material comprising a composition containing the (co)polymer.

BACKGROUND ART

A so-called silicone resin such as dimethyl silicone rubber containing polydimethylsiloxane (PDMS) as a main component has excellent properties such as heat resistance, electrical insulation, weather resistance, flexibility, gas permeability, and chemical resistance, and is used for various industrial applications. Due to these characteristics, the silicone resin is used as a heat dissipation material for electric and electronic parts (Patent Document 1: JP-A 2015-71662). However, the silicone resin has poor thermal conductivity and low strength. Therefore, it is necessary to fill the silicone resin with a large amount of a filler or to subject the silicone resin to a chemical crosslinking treatment.

In general, it is known that polytetramethyl-p-silphenylenesiloxane (PTMPS) is a crystalline polymer having better heat resistance and mechanical strength than PDMS and having thermoplastic properties (Patent Document 2: JP-A 2010-253774). Therefore, it is expected to apply a mesogen/silicon compound (co)polymer such as PTMPS to a heat dissipation material due to heat resistance higher than a so-called silicone resin and high thermal conductivity derived from crystallinity thereof. However, there has been no example actually using the mesogen/silicon compound (co)polymer as a heat dissipation material.

PRIOR ART DOCUMENTS

Patent Documents

Patent Document 1: JP-A 2015-71662
Patent Document 2: JP-A 2010-253774

SUMMARY OF THE INVENTION

Problems to be Solved By the Invention

The present invention has been achieved in view of the above circumstances, and an object of the present invention is to provide a heat dissipation material comprising a highly thermally conductive mesogen/silicon compound (co)polymer which can be suitably used as a heat dissipation material or a resin material, for example, for semiconductor devices and electronic parts, and a heat dissipation material comprising a composition containing the (co)polymer.

Means for Solving the Problems

As a result of intensive studies for achieving the above object, the present inventors have found that a mesogen/silicon compound (co)polymer having a number average molecular weight of 1,000 to 500,000, represented by a composition formula (1) described below has excellent thermal conductivity, further has thermoplastic properties, and has excellent moldability, have found that the mesogen/silicon compound (co)polymer and a composition containing the mesogen/silicon compound (co)polymer can be suitably used as a heat dissipation material, particularly as a resin material for semiconductor devices and electronic parts, and have completed the present invention.

Therefore, the present invention provides a heat dissipation material comprising the following mesogen/silicon compound (co)polymer having high thermal conductivity, and a heat dissipation material comprising a composition containing the (co)polymer.

[1] A heat dissipation material comprising a mesogen/silicon compound (co)polymer having a number average molecular weight of 1,000 to 500,000, represented by the following general formula (1):

[Chemical Formula 1]

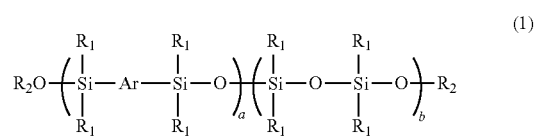
(1)

wherein Ar represents a mesogen group selected from structures represented by the following formulas:

[Chemical Formula 2]

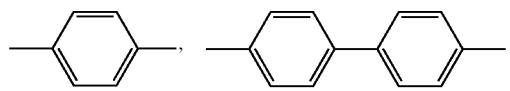

a represents a positive number of 0.5 to 1, and b represents a number of 0 to 0.5 (with the caveat that a and b each represent a ratio of each number of repeating units to the sum of the total repeating units in a molecule, and a+b=1). $R_1$s each independently represent a monovalent hydrocarbon group free of $C_{1-8}$ aliphatic unsaturated bond, and $R_2$s each independently represent a hydrogen atom, $-Si(CH_3)_3$, $-Si(CH_3)_2(OH)$, $-Si(CH_3)_2(CH=CH_2)$, or $-Si(CH_3)_2(CH_2-CH=CH_2)$.

[2] A heat dissipation material comprising a mesogen/silicon compound (co)polymer composition containing 100 to 1,500 parts by mass of a thermally conductive filler with respect to 100 parts by mass of a mesogen/silicon compound (co)polymer having a number average molecular weight of 1,000 to 500,000, represented by the following general formula (1):

[Chemical Formula 3]

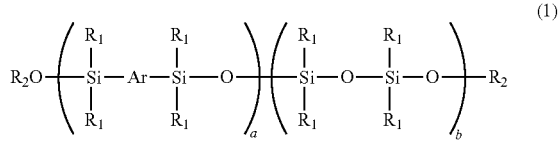
(1)

wherein Ar represents a mesogen group selected from structures represented by the following formulas:

[Chemical Formula 4]

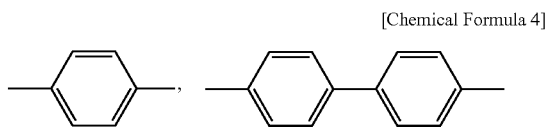

a represents a positive number of 0.5 to 1, and b represents a number of 0 to 0.5 (with the caveat that a and b each represent a ratio of each number of repeating units to the sum of the total repeating units in a molecule, and a+b=1). $R_1$s each independently represent a monovalent hydrocarbon group free of $C_{1-8}$ aliphatic unsaturated bond, and $R_2$s each independently represent a hydrogen atom, —$Si(CH_3)_3$, —$Si(CH_3)_2(OH)$, —$Si(CH_3)_2(CH=CH_2)$, or —$Si(CH_3)_2(CH_2—CH=CH_2)$.

[3] The heat dissipation material according to [2], wherein the mesogen/silicon compound (co)polymer composition is melted and has fluidity, in a temperature range of a melting point ±50° C. of the mesogen/silicon compound (co)polymer represented by the above general formula (1).

[4] The heat dissipation material according to [2] or [3], wherein the mesogen/silicon compound (co)polymer composition has thermal conductivity of 1 W/m·K or more.

[5] The heat dissipation material according to any one of [1] to [4], wherein the mesogen/silicon compound (co)polymer alone has thermal conductivity of 0.2 W/m·K or more.

ADVANTAGEOUS EFFECTS OF THE INVENTION

The heat dissipation material of the present invention has excellent thermal conductivity, further exhibits good thermoplastic properties, and has excellent moldability, and therefore can be suitably used as a heat dissipation material, particularly as a resin material for semiconductor devices and electronic parts.

EMBODIMENT FOR CARRYING OUT THE INVENTION

The heat dissipation material of the present invention contains a mesogen/silicon compound (co)polymer having a number average molecular weight of 1,000 to 500,000, represented by the following general formula (1):

[Chemical Formula 5]

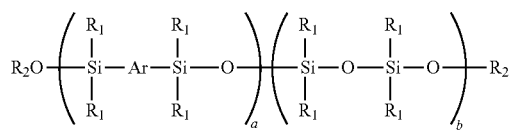

(1)

wherein Ar represents a mesogen group selected from structures represented by the following formulas:

[Chemical Formula 6]

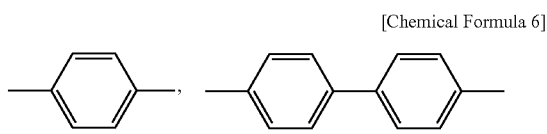

a represents a positive number of 0.5 to 1, and b represents a number of 0 to 0.5 (with the caveat that a and b each represent a ratio of each number of repeating units to the sum of the total repeating units in a molecule, and a+b=1). $R_1$s each independently represent a monovalent hydrocarbon group free of $C_{1-8}$ aliphatic unsaturated bond, and $R_2$s each independently represent a hydrogen atom, —$Si(CH_3)_3$, —$Si(CH_3)_2(OH)$, —$Si(CH_3)_2(CH=CH_2)$, or —$Si(CH_3)_2(CH_2—CH=CH_2)$.

The heat dissipation material of the present invention has excellent thermal conductivity, further exhibits good thermoplastic properties, and has excellent moldability, and therefore can be suitably used as a heat dissipation material, particularly as a resin material for semiconductor devices and electronic parts.

In the above formula (1), $R_1$s each independently represent a monovalent hydrocarbon group free of $C_{1-8}$, particularly $C_{1-6}$ aliphatic unsaturated bond. Specific examples thereof include an alkyl group such as a methyl group, an ethyl group, a propyl group, an isopropyl group, a butyl group, an isobutyl group, a tert-butyl group, a pentyl group, a neopentyl group, a hexyl group, or an octyl group, a cycloalkyl group such as a cyclohexyl group, and an aryl group such as a phenyl group, a tolyl group, or a xylyl group. A methyl group is preferable.

a represents a positive number of 0.5 to 1, preferably 0.7 to 1, more preferably 0.8 to 1, and b represents a number of 0 to 0.5, preferably 0 to 0.3, more preferably 0 to 0.2 (0 or a positive number) (with the caveat that a and b each represent a ratio (molar ratio) of each number of repeating units in a molecule, and a+b=1).

In the mesogen/silicon compound (co)polymer of general formula (1), the repeating number or the degree of polymerization of a silarylene siloxane unit [—$Si(R_1)_2$—Ar—$Si(R_1)_2O$—] in a main chain (this is referred to as a') is an integer of about 50 to 1,000, preferably about 50 to 800, more preferably about 80 to 600, the repeating number or the degree of polymerization of a disiloxane unit [—$Si(R_1)_2O$—$Si(R_1)_2O$—] in the main chain (this is referred to as b') is an integer of about 0 to 1,000, preferably about 10 to 800, more preferably about 20 to 200, and the total number of repeating units or the degree of polymerization of the entire main chain (this is referred to as a'+b') is an integer of about 50 to 2,000, preferably about 100 to 1,600, more preferably about 200 to 1,200.

Here, in the mesogen/silicon compound (co)polymer of general formula (1), the silarylene siloxane unit [—$Si(R_1)_2$—Ar—$Si(R_1)_2O$—] and the disiloxane unit [—$Si(R_1)_2O$—$Si(R_1)_2O$—] are arranged randomly.

The mesogen/silicon compound (co)polymer used in the heat dissipation material of the present invention has a number average molecular weight of 1,000 to 500,000, preferably 2,000 to 400,000, more preferably 3,000 to 300,000 in terms of polystyrene as measured by gel permeation chromatography using tetrahydrofuran as a developing solvent. If a weight average molecular weight is too small, a resin may be brittle and it may be difficult to handle the resin. If the weight average molecular weight is too large, the viscosity at the time of melting increases and it is difficult to fill the resin with a filler.

Note that the above number average molecular weight in terms of polystyrene can be measured by gel permeation chromatography under conditions of column manufactured by Tosoh Corporation: TSKgel Super H2500 (one column) and TSKgel Super HM-N (one column), solvent: tetrahydrofuran, flow rate: 0.6 mL/min, detector: RI (40° C.), column temperature: 40° C., injection amount: 50 μL, and sample concentration: 0.3% by mass (hereinafter the same).

The mesogen/silicon compound (co)polymer used in the heat dissipation material of the present invention preferably has thermal conductivity of 0.2 W/m·K or more, more preferably 0.2 to 1.0 W/m·K, still more preferably 0.25 to 1.0 W/m·K. Note that the thermal conductivity can be measured by a hot disc method (TPA-501, manufactured by Kyoto Electronics Industry Co., Ltd.) using two sheets each having a thickness of 6 mm (with a thickness of 12 mm) (hereinafter the same).

The mesogen/silicon compound (co)polymer used in the heat dissipation material of the present invention preferably has a melting point of 50 to 250° C., particularly preferably 80 to 230° C. Note that the melting point can be determined from a peak top of a melting endothermic peak measured by differential scanning calorimetry (DSC) (DSC 830, manufactured by Mettler Toledo) (hereinafter the same).

In the mesogen/silicon compound (co)polymer of the present invention represented by general formula (1), a compound in which $R_2$ represents a hydrogen atom (a compound having both molecular chain terminals blocked with silanol groups) can be manufactured by a known method. A method for manufacturing a compound in which $R_2$ represents $—Si(CH_3)_3$, $—Si(CH_3)_2(OH)$, $—Si(CH_3)_2(CH=CH_2)$, or $—Si(CH_3)_2(CH_2—CH=CH_2)$ (a compound having both molecular chain terminals blocked with siloxy groups) is as follows. That is, using an organopolysiloxane compound having both molecular chain terminals blocked with hydroxy groups (silanol groups) bonded to silicon atoms and having an arylene group in a main chain, represented by the following general formula (2) and manufactured by a known method, as a starting raw material, this organopolysiloxane compound is mixed with a disiloxane compound or a linear diorganopolysiloxane having both molecular chain terminals blocked with triorganosiloxy groups or hydroxydiorganosiloxy groups (for example, a disiloxane compound having both molecular chain terminals blocked with alkenyl group-containing diorganosiloxy groups such as vinyldimethylsiloxy groups or allyldimethylsiloxy groups, triorganosiloxy group such as trimethylsiloxy groups, or hydroxy group-containing diorganosiloxy groups such as hydroxydimethylsiloxy groups (for example, hexaorganodisiloxane or 1,3-dihydroxytetraorganodisiloxane), or an existing terminal silyl-modified silicone oil such as a linear diorganopolysiloxane having a degree of polymerization of 3 or more, such as linear dimethylpolysiloxane), and the resulting mixture is subjected to an equilibration reaction (cleavage of siloxane bond/recombination reaction) under an acidic catalyst.

[Chemical Formula 7]

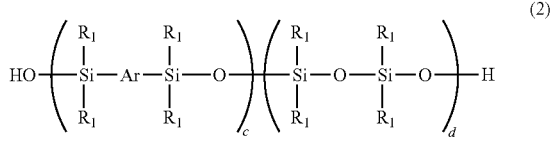

(2)

wherein Ar and $R_1$ are the same as Ar and $R_1$ in formula (1). c represents a positive number of 0.5 to 1, and d represents a number of 0 to 0.5 (with the caveat that c and d each represent a ratio of each number of repeating units in a molecule, and c+d=1).

In general formula (2), c representing a ratio of the number of repeating units of a silarylene siloxane unit $[—Si(R_1)_2—Ar—Si(R_1)_2O—]$ in a molecule is a positive number of about 0.5 to 1, preferably about 0.7 to 1, more preferably about 0.8 to 1, and d representing a ratio of the number of repeating units of a disiloxane unit $[—Si(R_1)_2O—Si(R_1)_2O—]$ in a molecule is a number of about 0 to 0.5, preferably of about 0 to 0.3, more preferably of about 0 to 0.2. With the caveat that c+d=1.

In the mesogen/silicon compound (co)polymer of general formula (2), the repeating number or the degree of polymerization of a silarylene siloxane unit $[—Si(R_1)_2—Ar—Si(R_1)_2O—]$ in a main chain (this is referred to as c') is an integer of about 50 to 1,000, preferably about 50 to 800, more preferably about 80 to 600, the repeating number or the degree of polymerization of a disiloxane unit $[—Si(R_1)_2O—Si(R_1)_2O—]$ in the main chain (this is referred to as d') is an integer of about 0 to 1,000, preferably about 10 to 800, more preferably about 20 to 200, and the total number of repeating units or the degree of polymerization of the entire main chain (this is referred to as c'+d') is an integer of about 50 to 2,000, preferably about 100 to 1,600, more preferably about 200 to 1,200.

Note that, in the compound of general formula (2), the silarylene siloxane unit $[—Si(R_1)_2—Ar—Si(R_1)_2O—]$ and the disiloxane unit $[—Si(R_1)_2O—Si(R_1)_2O—]$ are arranged randomly.

The organopolysiloxane compound having both molecular chain terminals blocked with silanol groups and having an arylene group in a main chain, represented by formula (2), has a number average molecular weight of preferably 1,000 to 500,000, more preferably 2,000 to 400,000, still more preferably 3,000 to 300,000 in terms of polystyrene as measured by gel permeation chromatography using tetrahydrofuran as a developing solvent.

Incidentally, if the organopolysiloxane compound having both molecular chain terminals blocked with silanol groups and having an arylene group in a main chain, represented by formula (2), is within a range of the mesogen/silicon compound (co)polymer of the present invention, represented by formula (1), this organopolysiloxane compound itself can be used as the mesogen/silicon compound (co)polymer represented by formula (1).

The organopolysiloxane compound having both molecular chain terminals blocked with silanol groups and having an arylene group in a main chain, represented by formula (2), can be obtained, for example, by a reaction between a compound having a silarylene structure, such as 1,4-bis(hydroxydimethylsilyl)benzene or 4,4-bis(hydroxydimethylsilyl) biphenyl, and a terminal hydroxy group-containing organosiloxane such as 1,1,3,3-tetramethyl-1,3-dihydroxydisiloxane at a ratio of about 1:0 to 1:1, preferably about 1:0 to 1:0.4 (molar ratio) in the presence of a polycondensation catalyst such as 1,1,3,3-tetramethylguanidine di-2-ethylhexanoate and, if necessary, an organic solvent at 60 to 250° C., particularly 80 to 130° C. for 4 to 48 hours, particularly 8 to 32 hours.

Examples of the disiloxane compound or the linear diorganopolysiloxane having both molecular chain terminals blocked with triorganosiloxy groups or hydroxydiorganosiloxy groups to react with the organopolysiloxane compound having both molecular chain terminals blocked with silanol groups and having an arylene group in a main chain, represented by the above formula (2) include a disiloxane compound having both molecular chain terminals blocked with alkenyl group-containing siloxy groups such as vinyldimethylsiloxy groups $(—OSi(CH_3)_2(CH=CH_2))$ or allyldimethylsiloxy groups (—OSi(CH$_3$)$_2$(CH$_2$—CH=CH$_2$)), triorganosiloxy groups such as trimethylsiloxy groups (—OSi(CH$_3$)$_3$), hydroxy group-containing diorganosiloxy groups such as hydroxydimethylsiloxy groups (—OSi(CH$_3$)$_2$(OH)), or the like, and an existing terminal silyl-modified silicone oil such as linear dimethylpolysiloxane (linear diorganopolysiloxane having a degree of polymerization of 3 or more).

In the disiloxane compound or the linear diorganopolysiloxane having both molecular chain terminals blocked with triorganosiloxy groups or hydroxydiorganosiloxy groups, an organic group bonded to a silicon atom in a diorganosiloxane unit is preferably a monovalent hydrocarbon group free of C$_{1-8}$ aliphatic unsaturated bond, and examples thereof include similar groups to those exemplified for R$_1$ in the above general formula (1). Among these groups, a methyl group is preferable.

The degree of polymerization of the linear diorganopolysiloxane having both molecular chain terminals blocked with triorganosiloxy groups or hydroxydiorganosiloxy groups is not particularly limited as long as being 3 or more, but is usually about 10 to 2,000, particularly preferably about 50 to 1,000, and extremely preferably about 100 to 500.

The disiloxane compound or the linear diorganopolysiloxane (terminal silyl-modified silicone oil) having both molecular chain terminals blocked with triorganosiloxy groups or hydroxydiorganosiloxy groups may be used singly or in combination of two or more types thereof having different degrees of polymerization.

In the equilibration reaction, a mixing ratio between the organopolysiloxane compound having both molecular chain terminals blocked with silanol groups and having an arylene group in a main chain, represented by formula (2), and the disiloxane compound or the linear diorganopolysiloxane having both molecular chain terminals blocked with triorganosiloxy groups or hydroxydiorganosiloxy groups is preferably about 1:0.5 to 1:10, and particularly preferably about 1:2 to 1:7.5 in terms of mass ratio. If the amount of the disiloxane compound or the linear diorganopolysiloxane having both molecular chain terminals blocked with triorganosiloxy groups or hydroxydiorganosiloxy groups is too small, the use amount of the silanol group-blocked organopolysiloxane having a relatively expensive arylene group is increased, and manufacturing cost may be increased. If the amount of the disiloxane compound or the linear diorganopolysiloxane having both molecular chain terminals blocked with triorganosiloxy groups or hydroxydiorganosiloxy groups is too large, the introduction amount of the arylene group is reduced, and characteristics of a targeted reaction product represented by the above general formula (1), such as thermal conductivity, mechanical strength, and thermoplastic properties may be poor.

As the acidic catalyst for promoting the equilibration reaction, any strong acid can be used. However, sulfuric acid, methanesulfonic acid, trifluoromethanesulfonic acid, and the like can be suitably used. Trifluoromethanesulfonic acid is particularly preferable because of the small use amount and easy post-treatment.

The addition amount of the acidic catalyst is desirably in a range of 100 to 10,000 ppm, and particularly desirably in a range of 500 to 3,000 ppm with respect to the total mass of the organopolysiloxane compound having both molecular chain terminals blocked with silanol groups and having an arylene group in a main chain, represented by formula (2), and the disiloxane compound or the linear diorganopolysiloxane having both molecular chain terminals blocked with triorganosiloxy groups or hydroxydiorganosiloxy groups.

The equilibration reaction is not particularly limited, but is performed under heating at usually about 80 to 150° C., particularly about 100 to 130° C., under conditions of usually about 0.5 to 6 hours, particularly about 1 to 4 hours. In this case, a solvent is arbitrarily added if necessary. Examples of the solvent include an aromatic nonpolar solvent such as benzene, toluene, or xylene.

By the equilibration reaction between the organopolysiloxane compound having both molecular chain terminals blocked with silanol groups and having an arylene group in a main chain, represented by formula (2), and the disiloxane compound or the linear diorganopolysiloxane having both molecular chain terminals blocked with triorganosiloxy groups or hydroxydiorganosiloxy groups, a compound in which R$_2$ represents —Si(CH$_3$)$_3$, —Si(CH$_3$)$_2$(OH), —Si(CH$_3$)$_2$(CH=CH$_2$), or —Si(CH$_3$)$_2$(CH$_2$—CH=CH$_2$) in the mesogen/silicon compound (co)polymer represented by the above general formula (1) can be manufactured easily and quantitatively with a high yield.

The heat dissipation material of the present invention can also use a mesogen/silicon compound (co)polymer composition containing a thermally conductive filler in the mesogen/silicon compound (co)polymer.

A generally used thermally conductive filler is used for the thermally conductive filler used in the composition. Examples thereof include: aluminum oxide, magnesium oxide, aluminum hydroxide, boron nitride, and carbon; a fine powder inorganic filler obtained by subjecting these to a surface treatment with a silane, a silazane, a low polymerization degree polysiloxane, or the like; and metallic powder such as aluminum, copper, iron, gold, or silver. Furthermore, aluminum oxide or aluminum is particularly desirable from a viewpoint of economy and thermal conductivity.

The content of the thermally conductive filler is preferably 100 to 1,500 parts by mass, and more preferably 250 to 1,000 parts by mass with respect to 100 parts by mass of the mesogen/silicon compound (co)polymer. If the blending amount is too small, intended thermal conductivity is not necessarily obtained. If the blending amount is too large, physical properties of a resin may decrease.

As a thermally conductive filler filling method, a mesogen/silicon compound (co)polymer and a thermally conductive filler are put in a planetary mixer and mixed for about 30 minutes at a melting point of the mesogen/silicon compound (co)polymer or higher to obtain a target composition.

The mesogen/silicon compound (co)polymer composition is melted preferably in a temperature range of the melting point ±50° C. of the above mesogen/silicon compound (co)polymer, particularly preferably in a temperature range of the melting point ±30° C. The mesogen/silicon compound (co)polymer composition preferably has fluidity.

Furthermore, the thermal conductivity of the mesogen/silicon compound (co)polymer composition is preferably 1 W/m·K or more, particularly preferably 1 to 10 W/m·K, and more preferably 1.5 to 10 W/m·K.

The heat dissipation material of the present invention can be suitably used particularly as a resin material for semiconductor devices and electronic parts.

EXAMPLES

Hereinafter, the present invention is described with reference to Synthesis Examples, Examples, and Comparative Examples. However, the present invention is not limited thereto.

First, Synthesis Examples of a monomer as a raw material of a mesogen/silicon compound (co)polymer used in the present invention are shown. These monomers are synthesized by a known method.

Synthesis Example 1

Synthesis of 1,4-bis(hydroxydimethylsilyl)benzene

In a 5 L separable flask equipped with a reflux tube and a 1 L dropping funnel, 500 mL of tetrahydrofuran, 2,500 mL of methyl ethyl ketone, 7.8 g of 5% by mass palladium-carrying carbon, and 172.8 g of deionized water were put, and the temperature was raised to 50° C. Subsequently, 757.6 g of 1,4-bis(dimethylsilyl)benzene (trade name Silphenylene C, manufactured by Shin-Etsu Chemical Co., Ltd.) was put in the dropping funnel, and dropwise addition was performed over four hours. After completion of the dropwise addition, aging was performed for five hours, the catalyst was removed by filtration, and the filtrate was concentrated to obtain a white solid. Subsequently, recrystallization purification was performed using a mixed solvent of 3 L of hexane and 500 mL of tetrahydrofuran to obtain 596.9 g of 1,4-bis(hydroxydimethylsilyl)benzene (yield 68%).

$^1$H-NMR (400 MHz, CDCl$_3$) δ 7.61 (s, 4H), 1.95 (brs, 2H), 0.41 (s, 12H)

Synthesis Example 2

Synthesis of 4,4-bis(hydroxydimethylsilyl)biphenyl

To a 3 L eggplant flask equipped with a reflux tube, 48 g of magnesium, 1 L of dry tetrahydrofuran, and a few drops of 1,2-dibromoethane were added, and the resulting mixture was heated under reflux under a nitrogen atmosphere. Subsequently, 250 g of 4,4'-dibromobiphenyl was added thereto, and the resulting mixture was heated under reflux for one hour to prepare a Grignard reagent. This Grignard reagent was transferred dropwise to a 3 L four-necked flask including 170 g of dimethylchlorosilane and 200 mL of tetrahydrofuran in an ice bath over one hour. After completion of the dropwise addition, a reaction was allowed to proceed overnight at room temperature. The residue was removed with a Kiriyama funnel, and then the resulting product was purified by distillation at 140-150° C./1 mmHg to obtain 4,4-bis(dimethylsilyl) biphenyl.

Using this 4,4-bis(dimethylsilyl) biphenyl as a raw material, 130 g of 4,4-bis(hydroxydimethylsilyl) biphenyl was obtained in a similar manner to the above synthesis method of 1,4-bis(hydroxydimethylsilyl)benzene (yield 47%).

$^1$H-NMR (400 MHz, CDCl$_3$) δ 7.68 (d, 4H), 7.60 (d, 4H), 1.76 (brs, 2H), 0.45 (s, 12H)

Example 1

To a 1 L eggplant flask equipped with a Dean Stark trap, 100 g of 1,4-bis(hydroxydimethylsilyl)benzene obtained in Synthesis Example 1, 800 mL of benzene, and 4 g of 1,1,3,3-tetramethylguanidine di-2-ethylhexanoate were added, and the resulting mixture was heated under reflux for 24 hours. Thereafter, the resulting solution was added dropwise to 3 L of methanol, and reprecipitation purification was performed to obtain 88 g of a white powder PTMPS (mesogen/silicon compound polymer) represented by the following chemical formula (2). An yield of 90%, number average molecular weight (Mn)=80,000, polydispersity index (PDI)=1.7, thermal conductivity=0.25 W/m·K, and melting point (mp)=125° C. were obtained. This polymer is referred to as polymer 1.

[Chemical Formula 8]

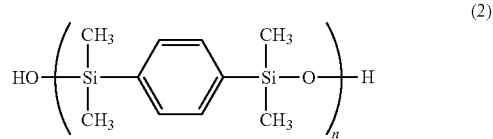

(2)

wherein n is a number such that the number average molecular weight is within the above range.

Example 2

To a 1 L eggplant flask equipped with a Dean Stark trap, 100 g of 4,4-bis(hydroxydimethylsilyl) biphenyl obtained in Synthesis Example 2, 800 mL of benzene, and 4 g of 1,1,3,3-tetramethylguanidine di-2-ethylhexanoate were added, and the resulting mixture was heated under reflux for 24 hours. Thereafter, the resulting solution was added dropwise to 3 L of methanol, and reprecipitation purification was performed to obtain 76 g of a white powder resin (mesogen/silicon compound polymer) represented by the following chemical formula (3). An yield of 79%, Mn=5,000, PDI=1.8, thermal conductivity=0.35 W/m·K, and mp=210° C. were obtained. This polymer is referred to as polymer 2.

[Chemical Formula 9]

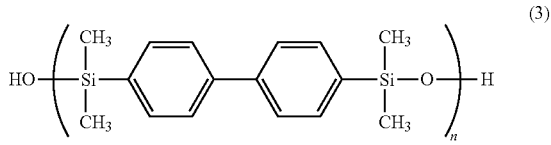

(3)

wherein n is a number such that the number average molecular weight is within the above range.

Example 3

To a 1 L eggplant flask equipped with a Dean Stark trap, 80 g of 1,4-bis(hydroxydimethylsilyl)benzene obtained in Synthesis Example 1, 14.67 g of 1,1,3,3-tetramethyl-1,3-dihydroxydisiloxane, 800 mL of benzene, and 4 g of 1,1,3,3-tetramethylguanidine di-2-ethylhexanoate were added, and the resulting mixture was heated under reflux for 24 hours. Thereafter, the resulting solution was added dropwise to 3 L of methanol, and reprecipitation purification was performed to obtain 82 g of a white powder resin (mesogen/silicon compound copolymer) represented by the following chemical formula (4). An yield of 87%, Mn=160,000, PDI=2.0, thermal conductivity=0.20 W/m·K, and mp=90° C. were obtained. This polymer is referred to as polymer 3.

[Chemical Formula 10]

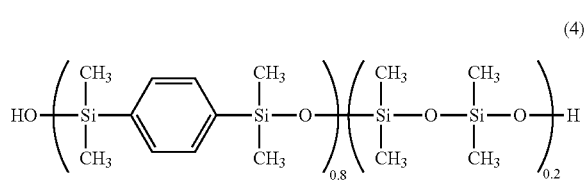

(4)

Example 4

To a 1 L eggplant flask equipped with a Dean Stark trap, 106.9 g of 4,4-bis(hydroxydimethylsilyl) biphenyl obtained in Synthesis Example 2, 14.67 g of 1,1,3,3-tetramethyl-1,3-dihydroxydisiloxane, 800 mL of benzene, and 4 g of 1,1,3,3-tetramethylguanidine di-2-ethylhexanoate were added, and the resulting mixture was heated under reflux for 24 hours. Thereafter, the resulting solution was added dropwise to 3 L of methanol, and reprecipitation purification was performed to obtain 100 g of a white powder resin (mesogen/silicon compound copolymer) represented by the following chemical formula (5). An yield of 85%, Mn=24,000, PDI=2.2, thermal conductivity=0.26 W/m·K, and mp=140° C. were obtained. This polymer is designated polymer 4.

[Chemical Formula 11]

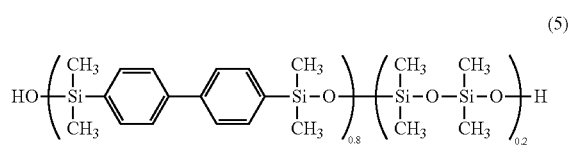

(5)

Example 5

In a planetary mixer, 50 g of the above polymer 1 and 185 g of spherical alumina (DAW-0745, manufactured by Denka Co., Ltd.) were put, were heated and mixed at 180° C., were poured into a mold of 60 mm×60 mm×6 mm, and were subjected to press molding at 150° C. for 10 minutes to obtain composition 1. Composition 1 had thermal conductivity of 1.58 W/m·K.

Example 6

In a planetary mixer, 50 g of the above polymer 2 and 185 g of spherical alumina (DAW-0745, manufactured by Denka Co., Ltd.) were put, were heated and mixed at 220° C., were poured into a mold of 60 mm×60 mm×6 mm, and were subjected to press molding at 220° C. for 10 minutes to obtain composition 2. Composition 2 had thermal conductivity of 2.14 W/m·K.

Example 7

In a planetary mixer, 50 g of the above polymer 3 and 185 g of spherical alumina (DAW-0745, manufactured by Denka Co., Ltd.) were put, were heated and mixed at 180° C., were poured into a mold of 60 mm×60 mm×6 mm, and were subjected to press molding at 150° C. for 10 minutes to obtain composition 3. Composition 3 had thermal conductivity of 1.28 W/m·K.

Example 8

In a planetary mixer, 50 g of the above polymer 4 and 185 g of spherical alumina (DAW-0745, manufactured by Denka Co., Ltd.) were put, were heated and mixed at 180° C., were poured into a mold of 60 mm×60 mm×6 mm, and were subjected to press molding at 150° C. for 10 minutes to obtain composition 4. Composition 4 had thermal conductivity of 1.61 W/m·K.

Comparative Example 1

In a planetary mixer, 48 g of a dimethylsilicone oil having both terminals blocked with alkenyl groups and having viscosity of 1,000 mPa·s, 1.96 g of an organohydrogenpolysiloxane containing four hydrogen atoms directly bonded to silicon atoms (molar ratio between terminal alkenyl group and Si—H group=1:1), and 185 g of spherical alumina (DAW-0745, manufactured by Denka Co., Ltd.) were put, and were mixed at room temperature for 30 minutes, 0.05 g of a 0.5% by mass Karstedt's catalyst toluene solution was added thereto, and the resulting mixture was further mixed for five minutes. This product was poured into a mold of 60 mm×60 mm×6 mm, and was subjected to press molding at 150° C. for 10 minutes to obtain cured product 5. Cured product 5 had thermal conductivity of 1.08 W/m·K.

Comparative Example 2

To a 1 L eggplant flask equipped with a Dean Stark trap, 20 g of 1,4-bis(hydroxydimethylsilyl)benzene obtained in Synthesis Example 1, 80 g of 1,1,3,3-tetramethyl-1,3-dihydroxydisiloxane, 800 mL of benzene, and 4 g of 1,1,3,3-tetramethylguanidine di-2-ethylhexanoate were added, and the resulting mixture was heated under reflux for 24 hours. Thereafter, the resulting solution was added dropwise to 3 L of methanol, and reprecipitation purification was performed to obtain 68 g of a highly viscous transparent liquid represented by the following chemical formula (6). An yield of 75%, Mn=240,000, and PDI=2.5 were obtained. This liquid was cooled to −30° C., but did not become a solid, and the thermal conductivity thereof could not be measured.

[Chemical Formula 12]

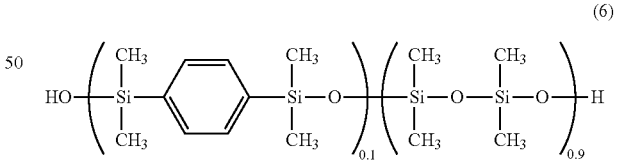

(6)

Various physical properties (hardness, tensile strength, and elongation) were evaluated using polymers 1 to 4, compositions 1 to 4, and cured product 5 obtained in the above Examples 1 to 8 and Comparative Example 1. In addition, the melting points of compositions 1 to 4 and cured Product 5 were measured. The results are indicated in Table 1 below. Incidentally, for various physical properties, a sheet of 100 mm×100 mm×2 mm was prepared by press molding at 150° C. for 10 minutes, and measurement was performed using an automatic hardness meter and a tensile tester. Note that conditions for physical property measurement were in accordance with JIS K 6249.

TABLE 1

| | Example | | | | | | | | Comparative Example |
|---|---|---|---|---|---|---|---|---|---|
| | 1 Polymer 1 | 2 Polymer 2 | 3 Polymer 3 | 4 Polymer 4 | 5 Composition 1 | 6 Composition 2 | 7 Composition 3 | 8 Composition 4 | 1 Cured product 5 |
| Hardness | D57 | D65 | D38 | D52 | D71 | D78 | D55 | D69 | A38 |
| Tensile strength: MPa | 22 | 28 | 12 | 17 | 21 | 25 | 15 | 24 | 1 |
| Elongation: % | 56 | 21 | 92 | 49 | 3 | 4 | 3 | 3 | 106 |
| Thermal conductivity: W/m·K | 0.25 | 0.35 | 0.20 | 0.26 | 1.58 | 2.14 | 1.28 | 1.61 | 1.08 |
| Melting point: °C. | 125 | 210 | 90 | 140 | 130 | 210 | 92 | 150 | None |

These results indicate that the heat dissipation material (Examples 1 to 4) consisting of the mesogen/silicon compound (co)polymer according to the present invention has thermal conductivity of 0.35 to 0.20 W/m·K which is better than that of a dimethylsilicone resin (Literature value 0.18 W/m·K) generally used as a conventional heat dissipation material, and also has excellent mechanical physical properties. Furthermore, the heat dissipation material (Examples 5 to 8) consisting of a composition containing the mesogen/silicon compound (co)polymer (resin) according to the present invention and a thermally conductive filler (filler) has thermoplastic properties, and therefore has better moldability than dimethyl silicone rubber (Comparative Example 1) requiring chemical crosslinking. It is known that the thermal conductivity of the heat dissipation material (Examples 5 to 8) consisting of a composition containing a resin and a filler is dramatically improved as the thermal conductivity of the resin is increased. Also in the resin of the present invention, the thermal conductivity after addition of a filler is largely improved as compared with a combination of a usual dimethyl silicone resin and a filler. From these facts, the heat dissipation material consisting of the mesogen/silicon compound (co)polymer of the present invention and the heat dissipation material consisting of a composition containing the (co)polymer and a thermally conductive filler are suitable as heat dissipation materials, and can be suitably used particularly as a resin material for semiconductor devices and electronic parts.

The invention claimed is:

1. A heat dissipation material comprising a mesogen/silicon compound (co)polymer composition containing 100 to 1,500 parts by mass of a thermally conductive filler with respect to 100 parts by mass of a mesogen/silicon compound (co)polymer having a number average molecular weight of 1,000 to 500,000, represented by the following general formula (1):

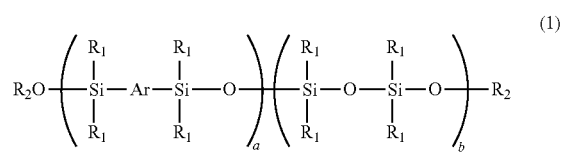

(1)

wherein

Ar represents a mesogen group selected from structures represented by the following formulas:

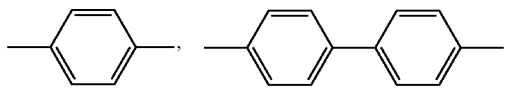

a represents a positive number of 0.5 to 1, and b represents a number of 0 to 0.5, with the proviso that a and b each represent a ratio of each number of repeating units to the sum of the total repeating units in a molecule, and a+b=1, $R_1$s each independently represent a $C_{1-8}$ monovalent hydrocarbon group free of aliphatic unsaturated bond, and $R_2$s each independently represent a hydrogen atom, —Si(CH$_3$)$_3$, —Si(CH$_3$)$_2$(OH), —Si(CH$_3$)$_2$(CH=CH$_2$), or —Si(CH$_3$)$_2$(CH$_2$—CH=CH$_2$).

2. The heat dissipation material according to claim 1, wherein the mesogen/silicon compound (co)polymer composition has fluidity, in a temperature range of the melting point to the melting point +50° C. of the mesogen/silicon compound (co)polymer represented by the general formula (1).

3. The heat dissipation material according to claim 1 or 2, wherein the mesogen/silicon compound (co)polymer composition has thermal conductivity of 1 W/m·K or more.

4. A heat dissipation material comprising a mesogen/silicon compound (co)polymer composition containing 100 to 1,500 parts by mass of a thermally conductive filler with respect to 100 parts by mass of a mesogen/silicon compound (co)polymer having a number average molecular weight of 1,000 to 500,000, said mesogen/silicon compound (co)polymer being represented by the following general formula (1):

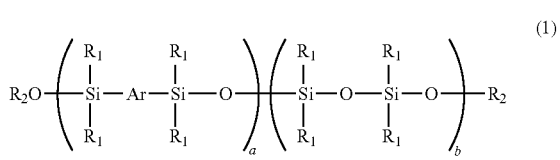

(1)

wherein each $R_1$ independently represents methyl or a $C_{2-8}$ monovalent hydrocarbon group free of aliphatic unsaturated bond, each $R_2$ independently represents a hydrogen atom, —Si(CH$_3$)$_3$, —Si(CH$_3$)$_2$(OH), —Si(CH$_3$)$_2$(CH=CH$_2$), or —Si(CH$_3$)$_2$(CH$_2$—CH=CH$_2$), Ar represents a mesogen group of structure represented by the following formula:

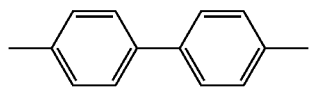
a represents a positive number of 0.5 to 1, and
b represents a number of 0 to 0.5,
   with the proviso that each of a and b represents a ratio of each number of repeating units to the sum of the total repeating units in a molecule, and a+b=1.
* * * * *